US011650279B2

(12) United States Patent
Kettinger et al.

(10) Patent No.: US 11,650,279 B2
(45) Date of Patent: May 16, 2023

(54) METHOD FOR CREATING DIFFUSION-WEIGHTED AND NON-DIFFUSION-WEIGHTED SCAN DATA BY MEANS OF MAGNETIC RESONANCE

(71) Applicant: Siemens Healthcare GmbH, Erlangen (DE)

(72) Inventors: Adam Kettinger, Bayern (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/485,724

(22) Filed: Sep. 27, 2021

(65) Prior Publication Data

US 2022/0099778 A1 Mar. 31, 2022

(30) Foreign Application Priority Data

Sep. 28, 2020 (DE) .......................... 102020212183.4

(51) Int. Cl.
*G01V 3/00* (2006.01)
*G01R 33/563* (2006.01)
*G01R 33/561* (2006.01)

(52) U.S. Cl.
CPC ... *G01R 33/56341* (2013.01); *G01R 33/5616* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2007/0052417 A1* 3/2007 Zhang .............. G01R 33/56341
324/309
2009/0069668 A1* 3/2009 Stemmer ................... G06T 7/11
382/130
(Continued)

FOREIGN PATENT DOCUMENTS

CN 105548928 A * 5/2016
CN 106556824 A * 4/2017 ............. A61B 5/055
(Continued)

OTHER PUBLICATIONS

Rohde G. K et al.; "Comprehensive Approach for Correction of Motion and Distortion in Diffusion-Weighted MRI" Magnetic Resonance in Medicine; vol. 51; pp. 103-114; 2004.
(Continued)

*Primary Examiner* — Walter L Lindsay, Jr.
*Assistant Examiner* — Frederick WEnderoth
(74) *Attorney, Agent, or Firm* — Banner & Witcoff Ltd.

(57) ABSTRACT

Techniques are disclosed for capturing scan data of an examination object via a magnetic resonance system. The techniques include capturing a first set of a diffusion-weighted scan data by excitation and, in an acquisition phase, acquiring a first echo signal, wherein before the acquisition phase in a diffusion preparation phase, diffusion gradients are switched for diffusion encoding of the scan data, The techniques additionally include capturing a second set of non-diffusion-weighted scan data by excitation and, in an acquisition phase, acquiring a second echo signal, wherein before the acquisition phase, in a diffusion preparation phase, the same diffusion gradients are switched as are switched for diffusion encoding of the scan data of the first set of diffusion-weighted scan data, although they have no influence on the second echo signal. Diffusion-weighted and non-diffusion-weighted scan data is thereby captured, hav-
(Continued)

Figure 1:
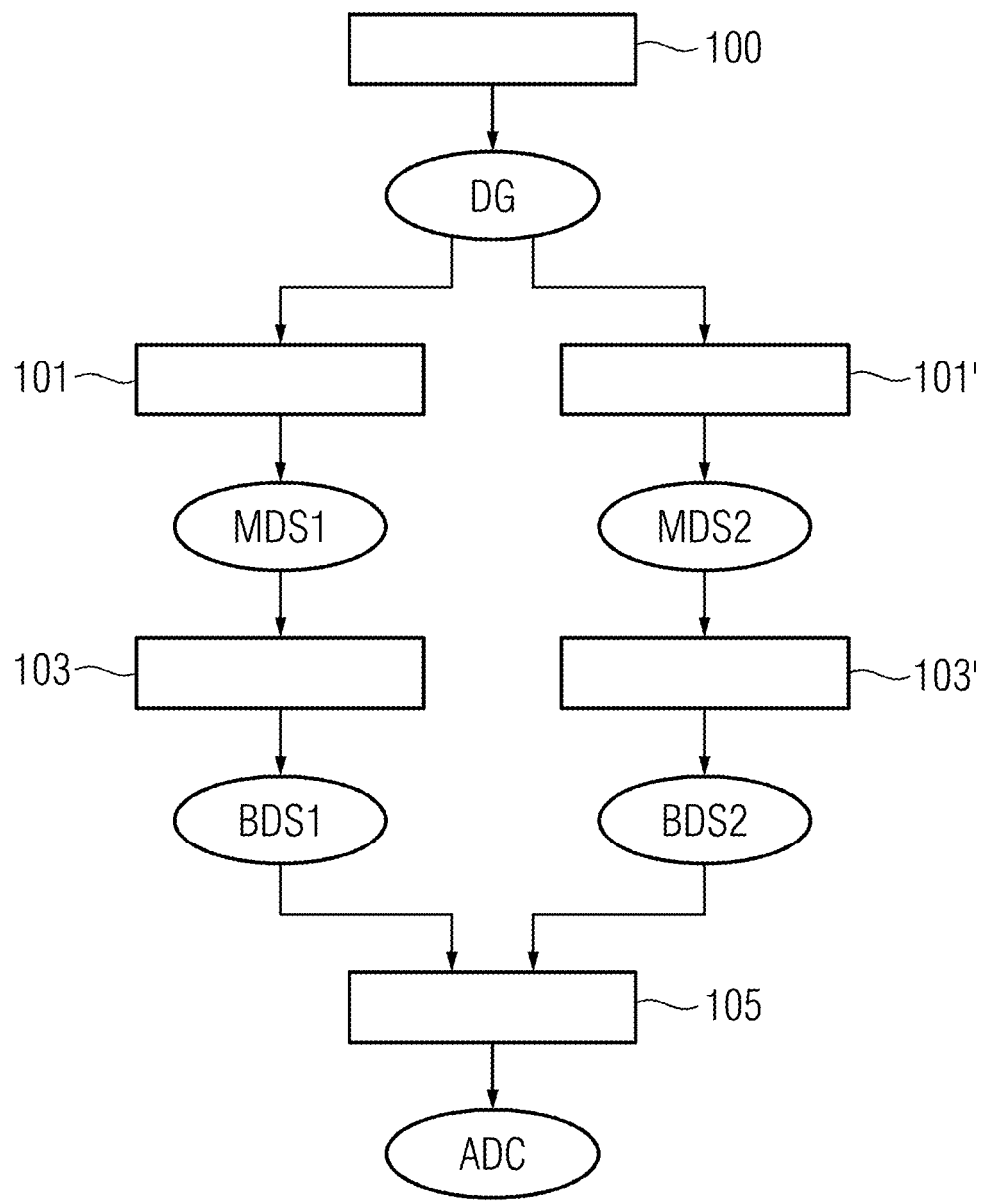

ing identical disturbances caused by eddy currents induced by switched gradients.

13 Claims, 4 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2010/0090695 A1* | 4/2010 | Kassai | G01R 33/56518 324/309 |
| 2015/0253406 A1* | 9/2015 | Nehrke | G01R 33/246 324/309 |
| 2016/0291108 A1* | 10/2016 | Niederloehner | G01R 33/5602 |
| 2017/0139026 A1* | 5/2017 | Beck | A61B 5/7207 |
| 2018/0017650 A1* | 1/2018 | de Oliveira | G01R 33/4818 |

FOREIGN PATENT DOCUMENTS

| | | | | |
|---|---|---|---|---|
| DE | 102015205693 A1 * | 10/2016 | | G01R 33/5616 |
| WO | WO-2014004870 A1 * | 1/2014 | | A61B 5/055 |

OTHER PUBLICATIONS

Reese T.G.: "Reduction of Eddy-Current-Induced Distortion in Diffusion MRI Using a Twice-Refocused Spin Echo", in Magnetic Resonance in Medicine, vol. 49, pp. 177-182, 2003.
German action dated Aug. 4, 2021, Application No. 10 2020 212183.4.

* cited by examiner

METHOD FOR CREATING DIFFUSION-WEIGHTED AND NON-DIFFUSION-WEIGHTED SCAN DATA BY MEANS OF MAGNETIC RESONANCE

CROSS-REFERENCE TO RELATED APPLICATIONS

The present application claims the benefit of the filing date of Germany patent application no. DE 10 2020 212 183.4, filed on Sep. 28, 2020, the contents of which are incorporated herein by reference in their entirety.

TECHNICAL FIELD

The disclosure relates to a method for creating diffusion-weighted and non-diffusion-weighted scan data by means of magnetic resonance, which have identical disturbances caused by eddy currents induced by switched gradients.

BACKGROUND

Magnetic resonance (MR) technology is a known technology with which images of the interior of an examination object can be generated. Expressed simply, for this purpose the examination object is positioned in a magnetic resonance device in a relatively strong, static, homogeneous main magnetic field, also known as the B0 field, with field strengths of 0.2 tesla to 7 tesla or more, so that its nuclear spins align along the main magnetic field. To trigger nuclear spin resonances that are measurable as signals, radio frequency excitation pulses (RF pulses) are radiated into the examination object, the nuclear spin resonances produced are measured as so-called k-space data and, on the basis thereof, MR images are reconstructed or spectroscopic data is determined. For position encoding of the scan data, rapidly-switched magnetic gradient fields, known as gradients for short, are overlaid on the main magnetic field. A pattern that is used, which defines a temporal sequence of RF pulses to be radiated in and gradients to be switched, is known as a pulse sequence (scheme) or "sequence." The recorded scan data is digitized and stored as complex numerical values in a k-space matrix. From the k-space matrix occupied with values, an associated MR image is reconstructed, for example, by means of a multi-dimensional Fourier transform.

Usually, a magnetic resonance recording is composed of a large number of individual partial scans in which raw data is acquired from different layers of the examination object, in order to subsequently reconstruct volume image data therefrom.

SUMMARY

Furthermore, in many investigations it is also necessary to carry out a plurality, i.e. a whole series of, magnetic resonance recordings of the examination object, wherein a particular measurement parameter is varied. Using the measurements, the effect of this measurement parameter on the examination object is observed to later draw diagnostic conclusions therefrom. A series should be understood as being at least two, but usually more than two, magnetic resonance recordings. Usefully therein, a measurement parameter is varied such that the contrast of a particular material type excited during the scans, for example of a tissue type of the examination object or of a chemical substance that is significant for most or for particular tissue types, for example water, is influenced as strongly as possible by the variation of the measurement parameter. This ensures that the effect of the measurement parameter on the examination object is particularly apparent.

A typical example for series of magnetic resonance recordings under the variation of a measurement parameter strongly influencing the contrast is so-called diffusion weighting imaging (DWI) methods. Diffusion should be understood to be the Brownian motion of molecules in a medium. During diffusion imaging, typically a plurality of images with different diffusion directions and weightings are acquired and combined with one another. The strength of the diffusion weighting is usually defined by the so-called b-value. The diffusion images with different diffusion directions and weightings and/or the images combined therefrom can be used for diagnostic purposes. Thus, with suitable combinations of the diffusion-weighted images acquired, parameter maps with particular diagnostic significance can be created, for example maps which show the "apparent diffusion coefficient" (ADC) or the "fractional anisotropy" (FA).

In diffusion-weighted imaging, additional gradients that reveal the diffusion direction and weighting are inserted into a pulse sequence to make visible or measure the diffusion properties of the tissue. These gradients have the effect that tissue with rapid diffusion (e.g. cerebrospinal fluid (CSF)) is subject to a stronger signal loss than tissue with slow diffusion (e.g. the grey matter tissue of the brain). The resultant diffusion contrast is becoming increasingly significant clinically, and applications now go far beyond the classic early recognition of ischemic stroke.

Diffusion imaging is often based upon echoplanar imaging (EPI), due to the shorter acquisition time of the EPI sequence per image and its robustness in relation to movement. In the case of diffusion imaging with EPI, distortions, for example shearings and compressions, as well as so-called signal voids or possibly a weakened fat saturation, can occur in the diffusion-weighted images even without a movement of the patient, which can additionally play a role, due to local B0 inhomogeneities and residual eddy current fields. The latter depend upon the direction and strength of the diffusion weighting. These distortions can lead to errors in the evaluated diffusion maps. These difficulties occur to a particularly great extent if a standard Steijskal-Tanner diffusion encoding is used. The distortions occur more strongly, firstly between diffusion-weighted images with high b-values, and secondly between diffusion-weighted images with low b-values, since these are distorted to a different extent, which makes a pixel-wise determination of ADC values impossible.

Methods are already known for preventing, correcting or at least reducing eddy current-related artifacts. First, methods are known which adapt the pulse sequence used, in particular the applied diffusion gradients, to the hardware conditions of a particular magnetic resonance system such that (as far as possible) no eddy currents are generated by the switched diffusion gradients during a recording of scan data, or such that eddy currents generated cancel each other out during an acquisition of scan data. An eddy current prevention method of this type is described, for example, in the article by Reese et al. "Reduction of eddy-current-induced distortion in diffusion MRI using a twice-refocused spin echo," Magn. Reson. Med. 2003, 49: pp. 177-82. It is a disadvantage associated with this procedure, however, that the smallest possible echo time TE is also prolonged by the prolonged diffusion gradient forms needed herein, and this can lead to signal detriments. The distortions mentioned above are thereby reduced but cannot be entirely prevented.

On the other hand, methods are already known which attempt to correct or at least reduce the effects caused by the eddy currents. For this purpose, eddy current field maps, which show the behavior of the eddy currents, are determined and on the basis thereof eddy current-related distortions in diffusion image data are corrected. However, such eddy current field maps require separate measurements, which have to be carried out in advance. An example for such a procedure is described in the article by Rohde et al., "Comprehensive approach for correction of motion and distortion in diffusion-weighted MRI," Magn. Reson. Med. 2004, 51: pp. 103-14.

The two types of the aforementioned methods for correcting or preventing eddy current-related artifacts can also be combined. Therein, however, the aforementioned problems can also remain and a complete correction of the aforementioned distortions cannot be achieved. In addition, distortions generated in diffusion-weighted images (b>0) further differ greatly from distortions generated in non-diffusion-weighted images (b=0).

It is an object of the disclosure to enable a diffusion imaging which enables a pixel-wise processing of diffusion-weighted and non-diffusion-weighted images without losses in the accuracy.

The object is achieved by a method for capturing scan data of an examination object by means of a magnetic resonance system, computer program, and electronically readable data carrier as described in the specification and claims.

An inventive method for capturing scan data of an examination object by means of a magnetic resonance system comprises the steps:

capturing a first set of diffusion-weighted scan data by excitation and, in an acquisition phase (RO1), acquiring a first echo signal (E1), wherein before the acquisition phase (RO1) in a diffusion preparation phase (D1, D1'), diffusion gradients are switched for diffusion encoding of the scan data, capturing a second set of non-diffusion-weighted scan data by excitation and, in an acquisition phase (RO2) acquiring a second echo signal (E2), wherein before the acquisition phase (RO2) in a diffusion preparation phase (D2, D2'), the same diffusion gradients are switched as are switched for diffusion encoding of the scan data of the first set of diffusion-weighted scan data, although the same diffusion gradients have no influence on the second echo signal (E2).

By means of the capturing according to the embodiments of the disclosure, of a first set of diffusion-encoded scan data and a second set of non-diffusion-encoded scan data, in each case, while switching similar diffusion gradients, both sets of scan data are influenced in a similar way by eddy currents generated by the switched diffusion gradients.

On the basis of the first set of diffusion-weighted scan data, a first diffusion-weighted image dataset and, on the basis of the second set of non-diffusion-weighted scan data, a second non-diffusion-weighted image dataset, can be reconstructed. On the basis of such a first image dataset and such a second image dataset, for example, pixel-wise diffusion values, for example ADC values, can be determined. In that both the diffusion-weighted and also the non-diffusion-weighted image dataset are reconstructed on the basis of scan data during the acquisition of which similar gradients, in particular diffusion gradients, have generated eddy currents in a similar way, both datasets are subject to similar distortions caused by the eddy currents. Due to the similarity of the distortions in the two image datasets, the two image datasets can readily be compared pixel-by-pixel. In particular, ADC values for the diffusion direction encoded with the switched diffusion gradients can be calculated pixel-by-pixel, so that an ADC map can be generated directly without further processing.

A magnetic resonance system according to the disclosure comprises a magnet unit, a gradient unit, a radio frequency unit, and a control apparatus designed for carrying out a method according to the disclosure with a pulse sequence adjusting unit.

A computer program according to the disclosure implements a method according to the disclosure on a control apparatus, when the computer program is executed on the control apparatus.

The computer program can also be present in the form of a computer program product, which is directly loadable into a memory store of a control apparatus, having program code means to carry out a method according to the disclosure when the computer program product is executed in the computer unit of the computer system.

An electronically readable data carrier according to the disclosure comprises electronically readable control information stored thereon, which comprises at least one computer program according to the disclosure, and is configured such that when the data carrier is used in a control apparatus of a magnetic resonance system, the at least one computer program carries out a method according to the disclosure.

The advantages and details set out in relation to the method apply accordingly for the magnetic resonance system, the computer program product, and the electronically readable data carrier.

BRIEF DESCRIPTION OF THE DRAWINGS/FIGURES

Figure 2:
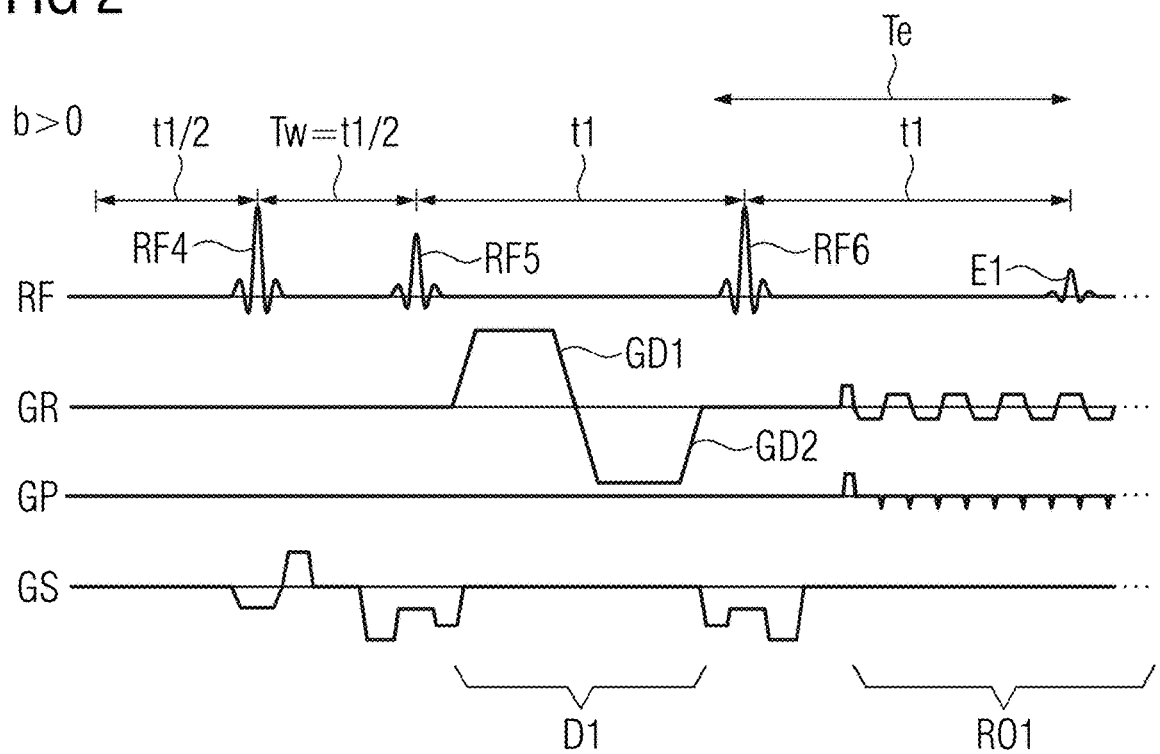
Figure 2:
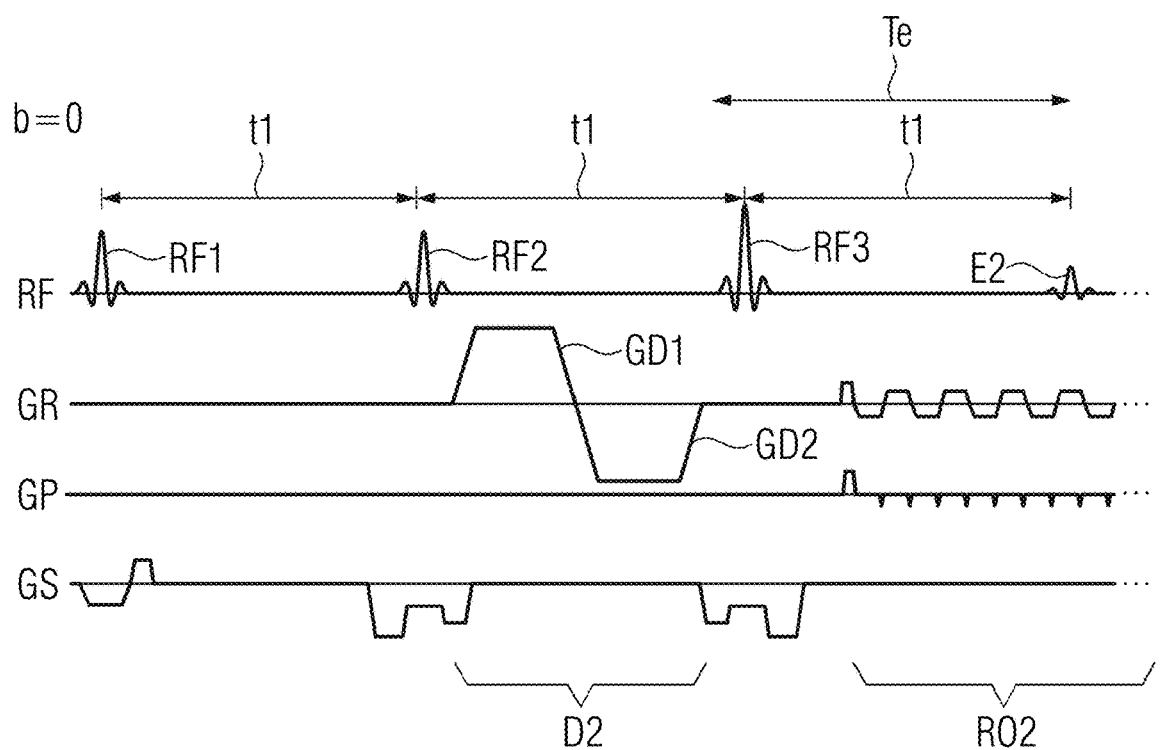
Figure 3:
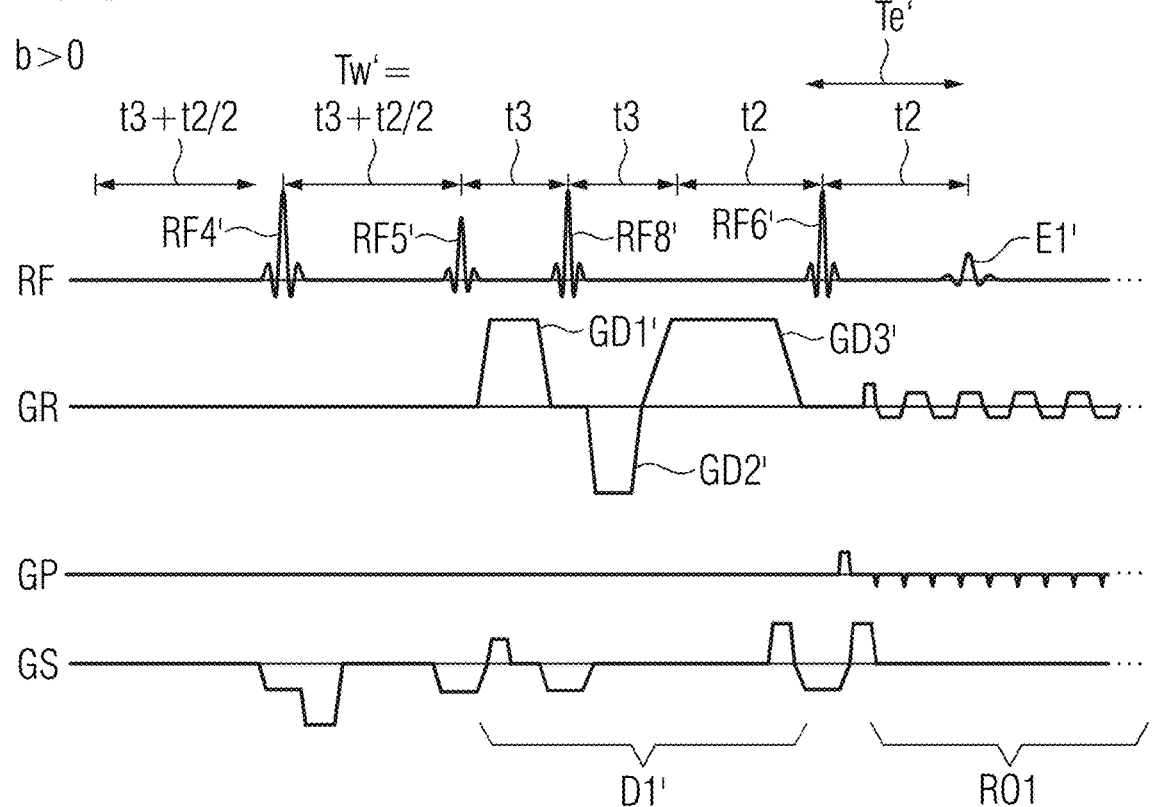
Figure 3:
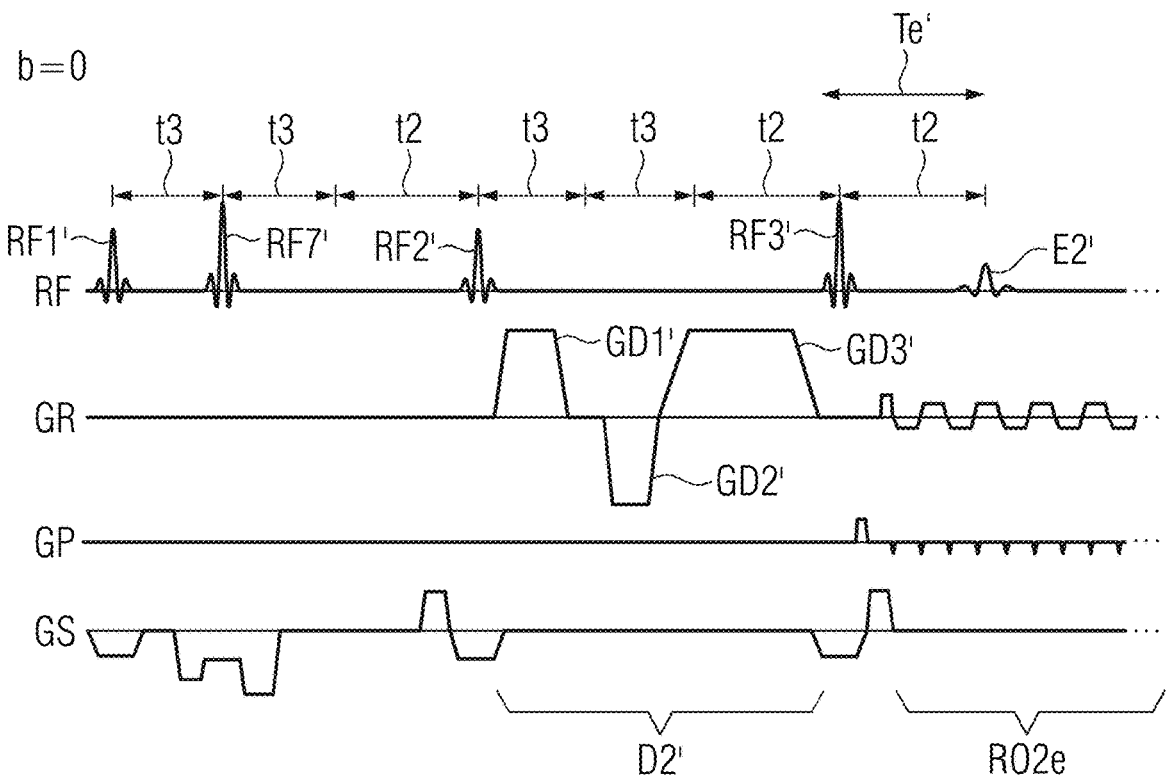
Figure 4:
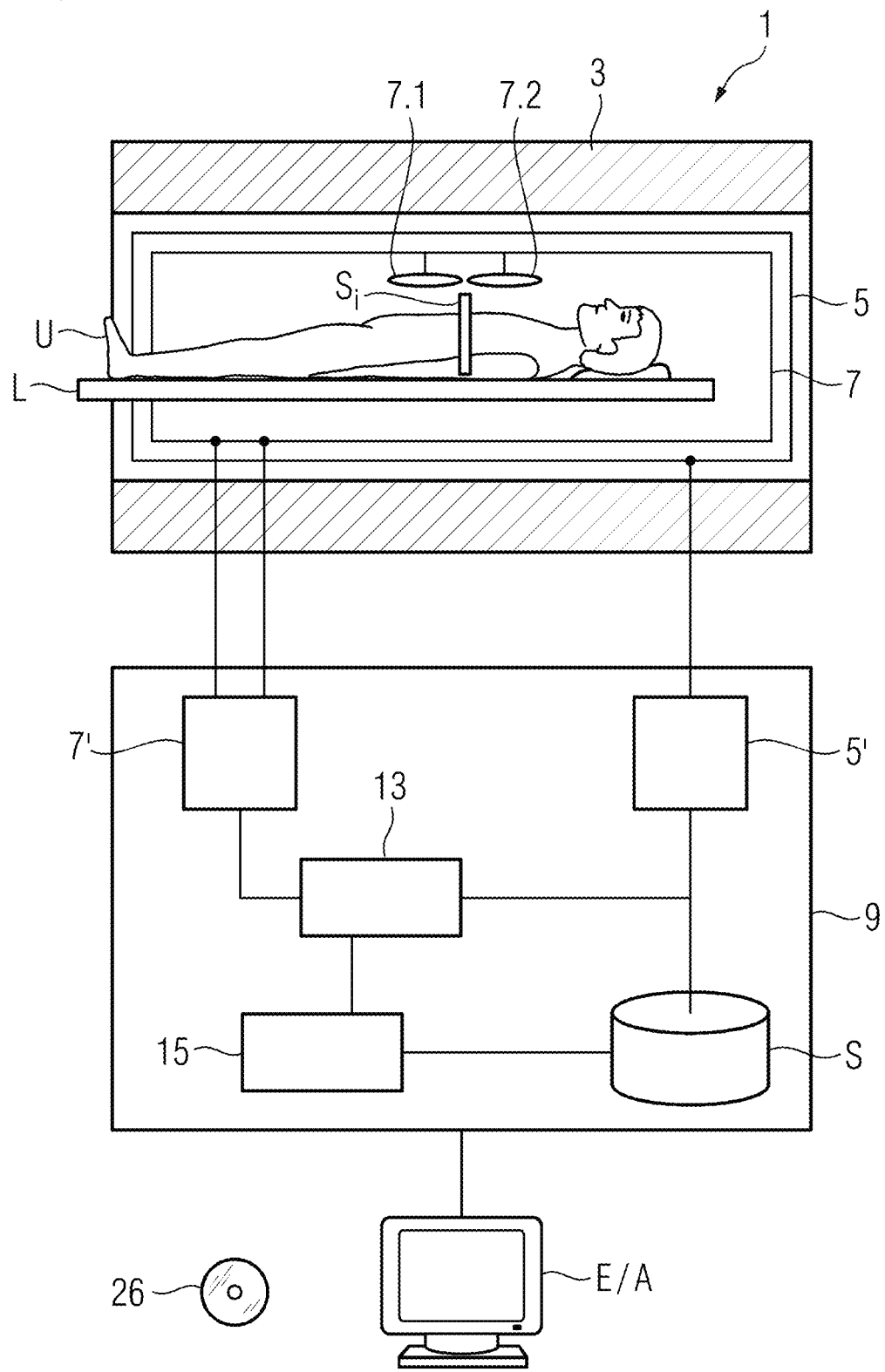

Further advantages and details of the present disclosure are disclosed in the following description of exemplary embodiments and by reference to the drawings. The examples given do not represent restrictions of the disclosure. In the drawings:

FIG. 1 is an example schematic flow diagram of a method according to one or more embodiments of the disclosure, FIG. 2 is an example schematic illustration of parts of pulse sequence schemes for capturing diffusion-weighted and non-diffusion-weighted scan data according to one or more embodiments of the disclosure, FIG. 3 is another example schematic illustration of parts of pulse sequence schemes for capturing diffusion-weighted and non-diffusion-weighted scan data according to one or more embodiments of the disclosure, FIG. 4 is an example schematic illustration of a magnetic resonance system according to one or more embodiments of the disclosure.

DETAILED DESCRIPTION

FIG. 1 is an example schematic flow diagram of a method according to one or more embodiments of the disclosure. FIG. 1 shows a schematic flow diagram of an inventive method for capturing scan data of an examination object by means of a magnetic resonance system.

Herein, a first set MDS1 of diffusion-weighted scan data are captured by means of excitation and, in an acquisition phase, a first echo signal (block 101) is acquired, wherein during the capturing 101 before the acquisition phase in a diffusion preparation phase, diffusion gradients DG are switched for diffusion encoding of the scan data.

Furthermore, a second set MDS2 of non-diffusion-weighted scan data are captured (block 101') by means of excitation and, in an acquisition phase, a second echo signal (block 101') is acquired, wherein during the capturing 101' before the acquisition phase in a diffusion preparation phase, the same diffusion gradients DG are switched as are switched for diffusion encoding of the scan data of the first set MDS1 of diffusion-weighted scan data, wherein however during the capturing 101', they have no influence on the second echo signal.

The diffusion gradients DG switched herein may be specified on the basis of an eddy current prevention procedure (block 100) as described, for example, in the article by Reese et al. mentioned above. In this way, the eddy currents generated by the switched diffusion gradients DG (equally for both captures 101 and 101') can be maintained as small as possible.

On the basis of the first set MDS1 of diffusion-weighted scan data, a first diffusion-weighted image dataset BDS1 can be reconstructed (block 103). Likewise, on the basis of the second set MDS2 of non-diffusion-weighted scan data, a second non-diffusion-encoded image dataset BDS2 can be reconstructed (block 103').

On the basis of the first image dataset BDS1 and the second image dataset BDS2, pixel-wise diffusion values, for example, ADC values, can be determined (block 105).

Since first and second image datasets BDS1 and BDS2 reconstructed from first and second sets of scan data MDS1 and MDS2 captured according to the disclosure are subject in a similar way to possible distortions caused by eddy currents generated by the switched diffusion gradients DG, a first and a second image dataset BDS1 and BDS2 can be processed pixel-wise without the distortions (since they are similar in both image datasets BDS1 and BDS2) negatively affecting a result of such a processing.

A reconstruction of a first image dataset BDS1 and of a second image dataset BDS2 can comprise a retrospective correction process, as described for example in the article by Rohde et al. mentioned above. By this means, distortions that are possibly present in the image datasets BDS1 and BDS2 can be reduced, wherein however, due to the similar correction, similar distortions can still be present in both image datasets BDS1 and BDS2.

Examples such as can be carried out in the case of a capture of a first set of diffusion-weighted scan data and an associated second set of non-diffusion-weighted scan data are shown in FIGS. 2 and 3 with schematically illustrated parts of pulse sequence schemes.

Shown in FIG. 2 in the upper region is a pulse sequence scheme for capturing a first set of diffusion-weighted scan data (b>0) and, in the lower region, a pulse sequence scheme for capturing an associated second set of non-diffusion-weighted scan data (b=0).

In the example shown in FIG. 2, a capture of a second set of non-diffusion-weighted scan data (b=0) comprises three RF pulses RF1, RF2, RF3, which are radiated in over the course of time, each with a temporal distance t1 between the first RF pulse RF1 and the second RF pulse RF2, and between the second RF pulse RF2 and the third RF pulse RF3. Simultaneously with the radiating-in of one of the RF pulses RF1, RF2, and/or RF3, for limiting the effect of the RF pulses RF1, RF2, and/or RF3 to a desired slice in the examination object in the slice selection direction GS, a slice selection gradient can be switched.

Assuming that a magnetization of the spins to be manipulated with the RF pulses RF1, RF2, and RF3 before the radiating-in of the first RF pulse RF1 is in an equilibrium state (which can be achieved, for example, with a sufficiently long waiting time for a complete relaxation of said spins between a possible prior manipulation of the spins and the radiating-in of the first RF pulse RF1), the first RF pulse RF1 excites the magnetization of the spins such that they are tilted from the longitudinal axis in which they lie in the equilibrium state, into the transverse plane, whereby a phase evolution of the magnetization in the transverse plane begins. The first RF pulse RF1 can thus be designated as the RF excitation pulse RF1.

The second RF pulse RF2 has properties such that when it is radiated in, a part of the magnetization tilted by the first RF pulse RF1 into the transverse plane is tilted again into the longitudinal axis, so that half of the magnetization is thereby inverted, including the phase accumulated up to the time point of the radiating-in of the RF pulse RF2. By this means, this part of the magnetization is stored in the longitudinal axis where no further phase evolution takes place, so that the inverted phase is maintained. Therefore, diffusion gradients GD1, GD2 switched in a diffusion preparation phase D2 following the second RF pulse RF2 have no influence on the magnetization stored in the longitudinal axis. The second RF pulse RF2 can be designated an RF storage pulse. The switched diffusion gradients GD1, GD2 are switched, for example, in the readout direction GR. However, all the types of diffusion gradients that are usual for diffusion scans come into consideration as switched diffusion gradients in desired diffusion directions with desired diffusion weightings. With the second RF pulse RF2, an excitation of the second echo signal E2 comprises a tilting of the magnetization of the spins generating the second echo signal E2 into a longitudinal magnetization direction before the diffusion preparation phase D2.

The third RF pulse RF3 is radiated in after completion of the diffusion preparation phase D2 and brings the magnetization stored in the longitudinal axis back again into the transverse plane where its phase evolution continues. The third RF pulse RF3 can be designated the RF restore pulse.

For instance, a second RF pulse RF2 for storing a part of the magnetization in the longitudinal axis, and a third RF pulse RF3 for restoring the stored magnetization, can be configured according to the model of a so-called driven equilibrium technique. The RF pulses RF1, RF2, and RF3 can, e.g., each have a flip angle of 90°.

Since the second RF pulse RF2 has inverted the phase of the stored magnetization, it is focused again during a further phase evolution after the radiating-in of the third RF pulse RF3, so that after a further temporal distance, the duration t1 after the radiating-in of the third RF pulse RF3, a second echo signal E2 forms. Thus, the second echo signal E2 is excited here as a stimulated echo signal E2.

This echo signal E2 can be acquired in any suitable (e.g. known) manner, for example as shown by means of an EPI readout train with a readout gradient GR switched in the readout direction and gradient blips switched in the phase-encoding direction GP, in an acquisition phase RO2, and to capture scan data of a second set of non-diffusion-encoded scan data. The acquisition phase RO2 can be configured for improving an achievable image contrast such that scan data captured in the k-space center is captured when the echo signal E2 has reached its maximum signal strength (i.e. in the example shown, a duration t1 after the radiating-in of the third RF pulse RF3 where the restored magnetization is fully refocused again).

As set out above, the scan data captured by acquiring the second echo E2 is non-diffusion-encoded, since the phase distribution of the magnetization generating the second echo E2 has not been influenced by the switched diffusion gradients GD1, GD2.

However, the diffusion gradients GD1, GD2 switched in the diffusion preparation phase D2 generate eddy currents, which influence the acquisition of the second echo signal E2 in the acquisition phase RO2.

The (relative) course of the amplitude of the signal path of the second echo signal E2 at different time points ZP is described for the example shown in FIG. 2 in the following table in which, without restriction of the generality, the value of the amplitude of the magnetization is assumed to be equal to one (=1) in the equilibrium state. The time point ZP=0 corresponds to the isodelay point of the first RF pulse RF1, the further time points are given by their temporal distance from ZP=0, wherein time points ZP denoted by + each correspond to a time point shortly after the time point given by the value, for example the time point ZP=0+ corresponds to the time point directly after the first RF pulse RF1. In the last column, the effect of the respective RF pulses is outlined.

| ZP | Orientation of the magnetization | Relative amplitude | Effect |
|---|---|---|---|
| 0 | Longitudinal | 1 | Excitation |
| 0+ | Transverse | 1 | Transverse (T2) relaxation |
| t1 | Transverse | $\exp(-t1/T2)$ | Tilting back into longitudinal + phase inversion |
| t1+ | Longitudinal | $\frac{1}{2} * \exp(-t1/T2)$ (the phase is inverted only for half of the spin population, hence the factor $\frac{1}{2}$) | Longitudinal (T1) relaxation |
| (2*t1) | Longitudinal | $\frac{1}{2} * \exp(-t1/T2) * \exp(-t1/T1)$ | Restore into the transverse plane |
| (2*t1)+ | Transverse | $\frac{1}{2} * \exp(-t1/T2) * \exp(-t1/T1)$ | T2 relaxation |
| 3*t1 | Transverse | $\frac{1}{2} * \exp(-t1/T2) * \exp(-t1/T1) * \exp(-t1/T2) = \exp(-2*t1/T2) * \exp(-t1/T1)$ | Formation of a stimulated echo signal |

As shown in FIG. 2 at the top, a capture of a first set of diffusion-weighted scan data (b>0) in the included RF pulses RF4, RF5, and RF6 (and the slice selection gradients switched simultaneously with the radiating-in of said RF pulses in the slice selection direction GS) differs from the associated capture of a second set of non-diffusion-weighted scan data (b=0), whereas the switched diffusion gradients GD1, GD2 included in a diffusion preparation phase D1 and the readout gradients and phase-encoding gradients switched in an acquisition phase RO1, as well as the temporal relation of the diffusion preparation phase D1 and the acquisition phase RO1 correspond to those of the diffusion preparation phase D2 and the acquisition phase RO2, which are used in the capture of the non-diffusion-weighted scan data.

In the example shown in FIG. 2 (b>0), directly before the diffusion preparation phase D1, an RF excitation pulse RF5, which tilts the magnetization of the spins to be manipulated into the transverse plane is radiated in, by means of which a phase evolution of the magnetization in the transverse plane begins. In the diffusion preparation phase D1, the same diffusion gradients GD1, GD2 (e.g. diffusion gradients having the same time and amplitude profiles, excepting for tolerances) are switched as in the capture of the associated non-diffusion-weighted scan data to achieve a diffusion encoding of the magnetization excited by the RF excitation pulse RF5. The diffusion gradients switched in the diffusion preparation phase D1 may be self-refocusing, i.e. their zeroth moment disappears before the acquisition phase RO1 for acquiring the first echo signal E1, for example not later than at the end of the diffusion preparation phase D1.

Following the diffusion preparation phase D1, at a temporal distance t1 after the radiating-in of the RF excitation pulse RF5, an RF refocusing pulse RF6, which inverts the phase of the magnetization prevailing in the transverse plane, is radiated in so that after a further temporal distance t1 after the radiating-in of the RF refocusing pulse RF6, a first echo signal E1 is excited as a spin echo signal E1. In the example shown in FIG. 2, the first echo signal E1 is therefore excited, e.g. as a singly refocused spin echo signal.

This spin echo signal E1 is acquired similarly to the acquisition of the associated second echo signal E2 for capturing the non-diffusion-encoded scan data, for example again as shown by means of an EPI readout train with readout gradients switched in the readout direction GR and gradient blips switched in the phase-encoding direction GP, in an acquisition phase RO1, and thus scan data of the first set of diffusion-encoded scan data is captured. Therein, the acquisition phase RO1 can again be configured such that scan data captured in the k-space center is captured when the echo signal E1 has reached its maximum signal strength (i.e. in the example shown, a duration t1 after the radiating-in of the RF refocusing pulse RF6 where the refocusing of the spin echo signal has been fully completed).

In the example shown in FIG. 2 (b>0), initially, during the capture of the non-diffusion-weighted scan data, an RF pulse RF4, which inverts the magnetization that exists in the longitudinal axis in the equilibrium state can be radiated in delayed relative to a corresponding time point ZP=0 by a temporal distance t1/2. The RF pulse RF4 can thus be designated as the RF inversion pulse. After a waiting time Tw following the radiating-in of the inversion pulse RF4, in which the longitudinal magnetization generated by the RF inversion pulse has had time to relax again according to the T1-relaxation time valid for the existing spins, the RF excitation pulse RF5 described above is radiated in.

The waiting time Tw can herein be selected such that the relaxation of the longitudinal magnetization achieved on expiry of the waiting time Tw corresponds to or is at least comparable with a relaxation of the longitudinal magnetization that has taken place there on capture of the associated non-diffusion-weighted scan data between the second RF pulse RF2 and the third RF pulse RF3.

If, for the T1-relaxation time T1 applicable for the existing spins, the following applies: T1>>t1 (T1 is significantly greater than the duration t1), this condition of the same relaxation of the respective longitudinal magnetization e.g. for a waiting time Tw=t1/2 is fulfilled.

An exemplary (relative) course of the amplitude of the signal path of the first echo signal E1 is described in the following table for the example shown in FIG. 2 at different time points ZP, at which without restriction of the generality, the value of the amplitude of the magnetization is assumed to be equal to one (=1) in the equilibrium state. For better comparability, the time point ZP=0 again corresponds to the isodelay point of the first RF pulse RF1 for the associated capture of non-diffusion-weighted scan data, the further time points ZP' are given by their temporal distance from ZP=0, wherein time points ZP denoted by + each correspond to a time point shortly after the time point given by the value, for example, the time point ZP=t1/2+ corresponds to the time point directly after the first RF inversion pulse RF4. In the last column, the effect of the respective RF pulses is outlined.

| ZP | Orientation of the magnetization | Relative amplitude | Effect |
|---|---|---|---|
| t1/2 | Longitudinal | 1 | Inversion |
| t1/2+ | Longitudinal | 1 | T1 relaxation |
| t1 | Longitudinal | 2 * exp(−(t1/2)/T1) − 1 | Excitation |
| t1+ | Transverse | 2 * exp(−(t1/2)/T1) − 1 | T2 relaxation |
| (2 * t1) | Transverse | [2 * exp(−(t1/2)/T1) − 1] * exp(−t1/T2) | Refocusing |
| (2 * t1)+ | Transverse | [2 * exp(−(t1/2)/T1) − 1] * exp(−t1/T2) | T2 relaxation |
| 3 * t1 | Transverse | [2 * exp(−(t1/2)/T1) − 1] * exp(−2 * t1/T2) | Formation of a spin echo signal |

In this way, both the first echo signal E1 and also the second echo signal E2 can achieve their maximum signal strength after an identical echo distance time Te following the end of the respective diffusion preparation phase D1, D2. The eddy currents generated by the (similar) diffusion gradients GD1, GD2 switched in the respective diffusion preparation phase D1, D2 thus act in a similar way both on the scan data of the first set of diffusion-weighted scan data MDS1 captured during the acquisition of the first echo signal E1 as diffusion-weighted scan data and also on the scan data of the second set of non-diffusion-weighted scan data MDS2 captured during the acquisition of the second echo signal E2 as non-diffusion-weighted scan data.

Making the assumption that the T1 relaxation time T1 is significantly greater for the existing spins than the duration t1 used in the pulse sequence schemes (T1>>t1), the magnetization remaining (for b=0 at the time point of the radiating-in of the third RF pulse RF3, or for b>0 after the waiting time Tw after the radiating-in of the RF inversion pulse RF4) in each case, on capture of non-diffusion-weighted (b=0) and diffusion-weighted (b>0) scan data, after the respective T1 relaxation can be estimated as follows by means of a first order development:

$b=0$: $\exp(-t1/T1) \sim 1 - t1/T1$;

$b>0$: $2*\exp(-(t1/2)/T1) - 1 \sim 2*(1-(t1/2)/T1) - 1 =$ $= 1 - t1/T1$.

Thus, (provided T1>>t1 is fulfilled), the T1 relaxation time can be assumed to be approximately equal both for the capture of the non-diffusion-weighted scan data and also for the capture of the diffusion-weighted scan data.

Further signal paths that could lead to unwanted further echo signals can be suppressed by switching spoiler gradients, as shown by way of example in FIG. 2, both for b=0 and also for b>0 shortly before and/or after the respectively radiated-in RF pulses RF1-RF6, in the slice selection direction.

A further example such as can be carried out in the case of a capture of a first set of diffusion-weighted scan data and an associated second set of non-diffusion-weighted scan data is shown in FIG. 3 with schematically illustrated parts of pulse sequence schemes.

Shown in FIG. 3 again in the upper region is a pulse sequence scheme for capturing a first set of diffusion-weighted scan data (b>0) and in the lower region a pulse sequence scheme for capturing an associated second set of non-diffusion-weighted scan data (b=0).

In the example shown in FIG. 3, a capture of a second set of non-diffusion-weighted scan data (b=0) comprises, in addition to a first, a second, and a third RF pulse RF1', RF2', and RF3', a further RF pulse RF7', wherein again simultaneously with the radiating-in of one of the RF pulses RF1', RF2', RF3', and/or RF7', for limiting the effect of the RF pulses RF1', RF2', RF3', and/or RF7' to a desired slice in the examination object in the slice selection direction GS, a slice selection gradient can be switched.

Again, assuming that a magnetization of the spins to be manipulated with the RF pulses RF1', RF2', RF3', and RF7' before the radiating-in of the first RF pulse RF1' is in an equilibrium state, the first RF pulse RF1' excites the magnetization of the spins such that they are tilted from the longitudinal axis in which they lie in the equilibrium state, into the transverse plane, whereby a phase evolution of the magnetization in the transverse plane begins. The first RF pulse RF1' can thus be designated the RF excitation pulse RF1'.

At a temporal distance of duration t3 after the radiating-in of the first RF pulse RF1', a further RF pulse RF7' is radiated in, which inverts the phase of the transverse magnetization generated by the first RF pulse RF1', so that at a temporal distance of duration t3 after the radiating-in of the RF refocusing pulse RF7', RF7' refocuses the transverse magnetization. The further RF pulse RF7' can thus be designated the RF refocusing pulse RF7'.

At a temporal distance of duration t3+t2, a second RF pulse RF2' is radiated in. The second RF pulse RF2' again has properties such that when it is radiated in, it again tilts into the longitudinal axis a part of the magnetization tilted by the first RF pulse RF1' into the transverse plane and inverted in its phase by the RF refocusing pulse RF7', wherein half of the magnetization is thereby inverted again, including its phase accumulated up to the time point of the radiating-in of the RF pulse RF2'. By this means, this part of the magnetization is stored in the longitudinal axis where no further phase evolution takes place, so that the inverted phase is maintained. Therefore, diffusion gradients GD1', GD2', GD3' switched in a diffusion preparation phase D2' following the second RF pulse RF2' have no influence on the magnetization stored in the longitudinal axis. The second RF pulse RF2' can be designated an RF storage pulse. The switched diffusion gradients GD1', GD2', GD3' are switched, for example, in the readout direction GR. However, all the types of diffusion gradients that are usual for diffusion scans come into consideration as switched diffusion gradients in desired diffusion directions with desired diffusion weightings. With the second RF pulse RF2', an excitation of the second echo signal E2' comprises a tilting of the magnetization of the spins generating the second echo signal E2' into a longitudinal magnetization direction before the diffusion preparation phase D2'.

A third RF pulse RF3' is radiated in after a temporal distance of duration 2*t3+t2 after the radiating-in of the second RF pulse RF2' and after completion of the diffusion preparation phase D2' and brings the magnetization stored in the longitudinal axis back again into the transverse plane where its phase evolution continues. The third RF pulse RF3' can be designated the RF restore pulse.

For instance, a second RF pulse RF2' for storing a part of the magnetization in the longitudinal axis and a third RF pulse RF3' for restoring the stored magnetization can be configured according to the model of a so-called driven equilibrium technique. The RF pulses RF1', RF2', and RF3' can, e.g. each have a flip angle of 90°.

Since the second RF pulse RF2' has inverted the phase of the stored magnetization, it is refocused again during its further phase evolution after the radiating-in of the third RF pulse RF3', so that after a further temporal distance, the duration t2 after the radiating-in of the third RF pulse RF3', a second echo signal E2' forms. Thus the second echo signal E2' is excited here as a stimulated echo signal E2.

This echo signal E2' can be acquired in any suitable (e.g. known) manner in an acquisition phase RO2', for example, as shown by means of an EPI readout train with a readout gradient GR switched in the readout direction GR and gradient blips switched in the phase-encoding direction GP, to capture scan data of a second set of non-diffusion-encoded scan data. The acquisition phase RO2' can be configured for improving an achievable image contrast such that scan data captured in the k-space center is captured when the echo signal E2' has reached its maximum signal strength (i.e. in the example shown, a duration t2 after the radiating-in of the third RF pulse RF3' where the restored magnetization is fully refocused again).

As set out above, the scan data captured by acquiring the second echo E2' is not diffusion-encoded, since the phase distribution of the magnetization generating the second echo E2' has not been influenced by the switched diffusion gradients GD1', GD2', GD3'.

However, the diffusion gradients GD1', GD2', GD3' switched in the diffusion preparation phase D2' generate eddy currents, which influence the acquisition of the second echo signal E2' in the acquisition phase RO2'.

The (relative) course of the amplitude of the signal path of the second echo signal E2' at different time points ZP' is described for the example shown in FIG. 3 in the following table, in which without restriction of the generality, the value of the amplitude of the magnetization is assumed to be equal to one (=1) in the equilibrium state. The time point ZP'=0 corresponds to the isodelay point of the first RF pulse RF1', the further time points are given by their temporal distance from ZP'=0, wherein time points ZP' denoted by + each correspond to a time point shortly after the time point given by the value, for example the time point ZP'=0+ corresponds to the time point directly after the first RF pulse RF1'. In the last column, the effect of the respective RF pulses is outlined.

| 0 | Longitudinal | 1 | Excitation |
|---|---|---|---|
| 0+ | Transverse | 1 | T2 relaxation |
| t1 | Transverse | $\exp(-t1/T2)$ | Refocusing |
| t1+ | Transverse | $\exp(-t1/T2)$ | T2 relaxation |
| (2 * t1 + t2) | Transverse | $\exp(-[2 * t1 + t2]/T2)$ | Tilting back into longitudinal + phase inversion |
| (2 * t1 + t2)+ | Longitudinal | $\frac{1}{2} * \exp(-[2 * t1 + t2]/T2)$ (the phase is inverted only for half of the spin population, therefore the factor $\frac{1}{2}$) | T1 relaxation |
| (2 * t1 + 2 * t2) | Longitudinal | $[\frac{1}{2} * \exp(-[2 * t1 + t2]/T2)] * \exp(-[2 * t1 + t2]/T1)$ | Restore into the transverse plane |
| (4 * t1 + 2 * t2)+ | Transverse | $[\frac{1}{2} * \exp(-[2 * t1 + t2]/T2)] * \exp(-[2 * t1 + t2]/T1)$ | T2 relaxation |
| 4 * t1 + 3 * t2 | Transverse | $[\frac{1}{2} * \exp(-[2 * t1 + t2]/T2)] * \exp(-[2 * t1 + t2]/T1) * \exp(-t2/T2) = \frac{1}{2} * \exp(-[2 * t1 + t2]/T1) * \exp(-2 * [t1 + t2]/T2)$ | Formation of a stimulated echo signal |

As shown in the example in FIG. 3 at the top, a capture of a first set of diffusion-weighted scan data (b>0) in the included RF pulses RF4', RF5', RF6', and RF8' (and the slice selection gradients switched simultaneously with the radiating-in thereof in the slice selection direction GS) differs from the associated capture of a second set of non-diffusion-weighted scan data (b=0), whereas the switched diffusion gradients GD1', GD2', GD3' included in a diffusion preparation phase D1' and readout gradients and phase-encoding gradients switched in an acquisition phase RO1', as well as the temporal relation of the diffusion preparation phase D1' and the acquisition phase RO1' correspond to those of the diffusion preparation phase D2' and the acquisition phase RO2' which are used in the capture of the non-diffusion-weighted scan data.

In the example shown in FIG. 3 (b>0), directly before the diffusion preparation phase D1', an RF excitation pulse RF5', which tilts the magnetization of the spins to be manipulated into the transverse plane is radiated in, whereby a phase evolution of the magnetization in the transverse plane begins. In the diffusion preparation phase D1', the same diffusion gradients GD GD2', GD3' (e.g. diffusion gradients having the same time and amplitude profiles, excepting for tolerances) are switched as in the capture of the associated non-diffusion-weighted scan data in order to achieve a diffusion encoding of the magnetization excited by the RF excitation pulse RF5'.

At a temporal distance of duration t3+t2/2 after the radiating-in of the RF excitation pulse RF5', an RF refocusing pulse RF8', which inverts the phase of the magnetization prevailing in the transverse plane, is radiated in so that said magnetization is refocused at a time point a duration t3 after the radiating-in of the RF refocusing pulse RF8', whereupon it can relax again. The RF refocusing pulse RF8' is radiated in within the diffusion preparation phase D1'.

The diffusion gradients switched in the diffusion preparation phase D1' may be self-refocusing, i.e. their zeroth moment disappears before the acquisition phase RO1 for acquiring the first echo signal E1', for example not later than the end of the diffusion preparation phase D1'. This is the case in the example shown in FIG. 3 (top, b>0) by virtue of the RF refocusing pulse RF8'.

Following the diffusion preparation phase D1', at a temporal distance of duration t3+t2 after the radiating-in of the RF excitation pulse RF8', a further RF refocusing pulse RF6', which inverts anew the phase of the magnetization prevailing in the transverse plane, is radiated in so that after a further temporal distance of duration t2 after the radiating-in of the further RF refocusing pulse RF6', a first echo signal E1' is excited as a spin echo signal E1'. In the example shown in FIG. 3, the first echo signal E1' is therefore excited, in particular, as a doubly refocused spin echo signal.

This spin echo signal E1' is acquired similarly to the acquisition of the associated second echo signal E2' for capturing the non-diffusion-encoded scan data, for example again as shown by means of an EPI readout train with readout gradients switched in the readout direction GR and gradient blips switched in the phase-encoding direction GP, in an acquisition phase RO1', and thus scan data of the first set of diffusion-encoded scan data is captured. Therein, the acquisition phase RO1' can again be configured such that scan data captured in the k-space center is captured when the echo signal E1 reaches its maximum signal strength (i.e. in the example shown, a duration t2 after the radiating-in of the further RF refocusing pulse RF6' where the refocusing of the spin echo signal has been fully completed).

In the example shown in FIG. 3 (b>0), initially, in the capture of the non-diffusion-weighted scan data delayed with a temporal distance t3+t2/2 relative to a corresponding time point ZP'=0, an RF pulse RF4' can be radiated in, which inverts the magnetization which prevails in the longitudinal axis in the equilibrium state. The RF pulse RF4' can thus be designated the RF inversion pulse. After a waiting time Tw' following the radiating-in of the inversion pulse RF4', in which the longitudinal magnetization generated by the RF inversion pulse RF4' has had time to relax again according to the T1-relaxation time valid for the existing spins, the RF excitation pulse RF5' described above is radiated in.

The waiting time Tw' can herein be selected such that the relaxation of the longitudinal magnetization achieved on expiry of the waiting time Tw' corresponds to or is at least comparable with a relaxation of the longitudinal magnetization present there during the capture of the associated non-diffusion-weighted scan data between the second RF pulse RF2' and the third RF pulse RF3'.

If, for the T1-relaxation time T1 applicable for the existing spins, the following applies: T1>>t1 (T1 is significantly greater than the duration t1), this condition of equal relaxation of the respective longitudinal magnetization e.g. for a waiting time Tw'=t3+t2/2 is fulfilled.

An exemplary (relative) course of the amplitude of the signal path of the first echo signal E1' is described in the following table for the example shown in FIG. 3 at different time points ZP' at which without restriction of the generality, the value of the amplitude of the magnetization is assumed to be equal to one (=1) in the equilibrium state. For better comparability, the time point ZP=O' again corresponds to the isodelay point of the first RF pulse RF1' for the associated capture of non-diffusion-weighted scan data, the further time points ZP' are given by their temporal distance from ZP'=0, wherein time points ZP' denoted by + each correspond to a time point shortly after the time point given by the value, for example the time point ZP'=(t3+t2/2) corresponds to the time point directly after the RF inversion pulse RF4'. In the last column, the effect of the respective RF pulses is outlined.

| ZP' | Orientation of the magnetization | Relative amplitude | Effect |
|---|---|---|---|
| (t3 + t2/2) | Longitudinal | 1 | Inversion |
| (t3 + t2/2)+ | Longitudinal | 1 | T1 relaxation |
| (2 * t3 + t2) | Longitudinal | 2 * exp(−[t3 + t2/2]/T1) − 1 | Excitation |
| (2 * t3 + t2)+ | Transverse | 2 * exp(−[t3 + t2/2]/T1) − 1 | T2 relaxation |
| (3 * t3 + t2) | Transverse | [2 * exp(−[t3 + t2/2]/T1) − 1] * exp(−t3/T2) | Refocusing |
| (3 * t3 + t2)+ | Transverse | [2 * exp(−[t3 + t2/2]/T1) − 1] * exp(−t3/T2) | T2 relaxation |
| (4 * t3 + 2 * t2) | Transverse | [2 * exp(−[t3 + t2/2]/T1) − 1] * exp(−[2 * t3 + t2]/T2) | Refocusing |
| (4 * t3 + 2 * t2)+ | Transverse | [2 * exp(−[t3 + t2/2]/T1) − 1] * exp(−[2 * t3 + t2]/T2) | T2 relaxation |
| 4 * t3 + 3 * t2 | Transverse | [2 * exp(−[t3 + t2/2]/T1) − 1] * exp(−2 * [t3 + t2]/T2) | Formation of a spin echo signal |

In this way, both the first echo signal E1' and also the second echo signal E2' can achieve their maximum signal strength after an identical echo distance time Te' following the end of the respective diffusion preparation phase D1', D2'. The eddy currents generated by the (similar) diffusion gradients GD1', GD2', GD3' switched in the respective diffusion preparation phase D1', D2' thus act in a similar way both on the scan data of the first set of diffusion-weighted scan data MDS1 captured during the acquisition of the first echo signal E1' as diffusion-weighted scan data and also on the scan data of the second set of non-diffusion-weighted scan data MDS2 captured during the acquisition of the second echo signal E2' as non-diffusion-weighted scan data.

Making the assumption that the T1 relaxation time T1 is significantly greater for the existing spins than the duration t3 used in the pulse sequence schemes (T1>>t3), the magnetization remaining (for b=0 at the time point of the radiating-in of the third RF pulse RF3', or for b>0 after the waiting time Tw' after the radiating-in of the RF inversion pulse RF4') in each case, on capture of non-diffusion-weighted (b=0) and diffusion-weighted (b>0) scan data, after the respective T1 relaxation can be estimated as follows by means of a development of the first order:

$b=0$: $\exp(-[2*t3+t2]/T1) \sim 1-[2*t3+t2]/T1$;

$b>0$: $2*\exp(-(t3+t2/2)/T1)-1 \sim 2*(1-(t3+t2/2)/T1)-1 =$ $= 1-[2*t3+t2]/T1$.

Thus (provided T1>>t3 is fulfilled), the T1 relaxation time can be assumed to be approximately equal both for the capture of the non-diffusion-weighted scan data and also for the capture of the diffusion-weighted scan data.

Further signal paths that could lead to unwanted further echo signals can be suppressed by switching spoiler gradients, as shown by way of example in FIG. 3, both for b=0 and also for b>0 shortly before and/or after the respectively radiated-in RF pulses RF1'-RF8', in the slice selection direction.

The method described herein is particularly advantageous if, altogether, diffusion-encoded scan data is to be acquired only for one diffusion direction, for example a diffusion direction diagonal to the physical axes of the magnetic resonance system. In this case, a capture according to the disclosure of a first set MDS1 of scan data that is diffusion-encoded in the desired diffusion direction and of a second set MDS2 of non-diffusion-encoded scan data enables, e.g. a direct pixel-wise calculation of diffusion values, such as for example ADC values, without a distortion caused by eddy currents in image datasets BDS1 and BDS2 reconstructed on the basis of the sets MDS1 and MDS2 of scan data leading to inconsistencies or deviations between the two image datasets BDS1 and BDS2.

If diffusion-encoded scan data is to be captured for a plurality of diffusion directions, for each desired diffusion direction a corresponding set of non-diffusion-encoded scan data can be acquired, in the creation of which the same diffusion gradients are switched as for a corresponding set of scan data diffusion-encoded in the desired diffusion direction, to be able to generate an ADC map, for example for each diffusion direction. Such ADC maps for different diffusion directions can be registered to one another in order to be able, for example in further processing steps, to determine for example diffusion tensors. In order to be able to keep the overall scan time as small as possible despite the sets MDS2 of non-diffusion-encoded scan data to be captured for each desired diffusion direction, during the capture of a set MDS2 of non-diffusion-encoded scan data, for example, a repetition of acquisitions (so-called averages) that is typical for diffusion scans can be reduced.

FIG. 4 schematically represents a magnetic resonance system 1 according to the disclosure. This system comprises a magnet unit 3 (e.g. a main magnet configured to generate the main magnetic field, which may include processing and/or control circuitry, one or more processors, software executing machine-readable instructions, or combinations of these) for generating the main magnetic field, a gradient unit 5 (e.g. gradient generation circuitry, one or more processors, software executing machine-readable instructions, or combinations of these) for generating the gradient fields, a radio frequency unit 7 (e.g. radio frequency generation circuitry, one or more processors, software executing machine-readable instructions, or combinations of these) for radiating in and receiving radio frequency signals, and a control apparatus 9 (e.g. control circuitry, one or more processors, software executing machine-readable instructions, or combinations of these) configured for carrying out a method according to the disclosure.

In FIG. 4, these subunits of the magnetic resonance system 1 are shown only roughly schematically. For instance, the radio frequency unit 7 can consist of a plurality of subunits, for example a plurality of coils such as the schematically shown coils 7.1 and 7.2 or more coils which can be configured either only to transmit radio frequency signals or only to receive the triggered radio frequency signals or for both.

In order to examine an examination object U, for example a patient or a phantom, it can be introduced on a support L into the magnetic resonance system 1, in the scanning volume thereof. The slice or the slab S, represents an exemplary target volume of the examination object from which data is to be acquired and captured as scan data.

The control apparatus 9 serves to control the magnetic resonance system 1 and can, e.g., control the gradient unit 5 by means of a gradient control system 5' (e.g. gradient control circuitry, one or more processors, software executing machine-readable instructions, or combinations of these) and the radio frequency unit 7 by means of a radio frequency transmitting/receiving control system 7'. The radio frequency unit 7 can herein comprise a plurality of channels on which signals can be transmitted or received.

The radio frequency unit 7 is responsible, together with its radio frequency transmitting/receiving control system 7', for the generation and radiating-in (transmission) of a radio frequency alternating field for manipulation of the spins in a region to be manipulated (for example in slices S to be scanned) of the examination object U. Herein, the center frequency of the radio frequency alternating field, also designated the B1 field, is typically adjusted so that, as far as possible, it lies close to the resonance frequency of the spins to be manipulated. Deviations of the center frequency from the resonance frequency are referred to as off-resonance. In order to generate the B1 field, in the radio frequency unit 7, currents controlled by means of the radio frequency transmitting/receiving control system 7' are applied to the HF coils.

Furthermore, the control apparatus 9 comprises a pulse sequence adjusting unit 15 (e.g. pulse sequence adjusting circuitry, one or more processors, software executing machine-readable instructions, or combinations of these) with which pulse sequences for the capture of first and second sets of scan data according to the disclosure can be determined, which pulse sequences can be implemented by the gradient control system 5' and the radio frequency transmitting/receiving control system 7'. The control apparatus 9 is configured overall to carry out any of the methods according to the disclosure.

A computer unit 13 (e.g. a computing device, computing circuitry, one or more processors, software executing machine-readable instructions, or combinations of these) comprised by the control apparatus 9 is configured to carry out all the computation operations necessary for the required scans and determinations. Results and intermediate results needed for this or determined herein can be stored in a storage unit S of the control apparatus 9. The units shown are herein not necessarily to be understood as physically separate units, but represent merely a subdivision into units of purpose which, however, can also be realized for example in fewer, or even only in one, physical unit.

By means of an input/output apparatus E/A (e.g. a user interface, displays, etc.) of the magnetic resonance system 1, control commands can be passed for example by a user to the magnetic resonance system and/or results from the control apparatus 9 such as, for example, image data can be displayed.

A method described herein can also exist in the form of a computer program product which comprises a program and implements the described method on a control apparatus 9 when said program is executed on the control apparatus 9. An electronically readable data carrier 26 (e.g. a non-transitory computer-readable medium) with electronically readable control information stored thereon (e.g. readable and executable instructions) can also be provided, said control information comprising at least one computer program product as described above and being configured, on use of the data carrier 26 in a control apparatus 9 of a magnetic resonance system 1, to carry out the method described.

What is claimed is:

1. A method for capturing scan data of an examination object via a magnetic resonance system, comprising:
   capturing a set of diffusion-weighted scan data via excitation;
   during a first acquisition phase, acquiring a first echo signal;
   during a first diffusion preparation phase prior to the first acquisition phase, switching first diffusion gradients for diffusion encoding of the set of diffusion-weighted scan data;
   capturing a set of non-diffusion-weighted scan data by excitation;
   during a second acquisition phase, acquiring a second echo signal;
   during a second diffusion preparation phase prior to the second acquisition phase, switching second diffusion gradients that have the same time and amplitude profile as the first diffusion gradients switched for the diffusion encoding of the set of diffusion-weighted scan data; and
   displaying image data based upon the first set of diffusion-weighted scan data and the second set of non-diffusion-weighted scan data,
   wherein the switching of the second diffusion gradients does not influence the second echo signal.

2. A magnetic resonance (MR) system, comprising:
   a magnet configured to generate a main magnetic field;
   a gradient unit;
   a radio frequency unit; and
   a control apparatus with a radio frequency transmitting/receiving control system and a pulse sequence adjusting unit,
   wherein the control apparatus is configured to cause the MR system to capture scan data of an examination object via the magnetic resonance system by:
   capturing a set of diffusion-weighted scan data via excitation;
   during a first acquisition phase, acquiring a first echo signal;

during a first diffusion preparation phase prior to the first acquisition phase, switching first diffusion gradients for diffusion encoding of the set of diffusion-weighted scan data;

capturing a set of non-diffusion-weighted scan data by excitation;

during a second acquisition phase, acquiring a second echo signal;

during a second diffusion preparation phase prior to the second acquisition phase, switching second diffusion gradients that have the same time and amplitude profile as the first diffusion gradients switched for the diffusion encoding of the set of diffusion-weighted scan data, wherein the switching of the second diffusion gradients does not influence the second echo signal; and an input/output interface configured to display image data based upon the first set of diffusion-weighted scan data and the second set of non-diffusion-weighted scan data.

3. A non-transitory computer-readable medium having at least one computer program stored thereon that, when used in a control apparatus of a magnetic resonance (MR) system, cause the MR system to:

capture scan data of an examination object via the magnetic resonance system by:

capturing a set of diffusion-weighted scan data via excitation;

during a first acquisition phase, acquiring a first echo signal;

during a first diffusion preparation phase prior to the first acquisition phase, switching first diffusion gradients for diffusion encoding of the set of diffusion-weighted scan data;

capturing a set of non-diffusion-weighted scan data by excitation;

during a second acquisition phase, acquiring a second echo signal; and during a second diffusion preparation phase prior to the second acquisition phase, switching second diffusion gradients that have the same time and amplitude profile as the first diffusion gradients switched for the diffusion encoding of the set of diffusion-weighted scan data, wherein the switching of the second diffusion gradients does not influence the second echo signal; and display image data based upon the first set of diffusion-weighted scan data and the second set of non-diffusion-weighted scan data.

4. The method as claimed in claim 1, wherein the first echo signal and the second echo signal achieve a maximum signal strength, respectively, after an identical echo distance time following an end of each respective diffusion preparation phase.

5. The method as claimed in claim 1, wherein an excitation of the second echo signal comprises a tilting of a magnetization of spins generating the second echo signal into a longitudinal magnetization direction prior to the second diffusion preparation phase.

6. The method as claimed in claim 1, wherein the second echo signal is excited as a stimulated echo signal.

7. The method as claimed in claim 1, wherein the first echo signal is excited as a spin echo signal.

8. The method as claimed in claim 1, wherein the first echo signal is a single-refocused or a twice-refocused spin echo signal.

9. The method as claimed in claim 1, wherein prior to an excitation of the first echo signal, an inversion pulse is radiated in.

10. The method as claimed in claim 1, wherein a zeroth moment of the first diffusion gradients that are switched during the first diffusion preparation phase disappears prior to the first acquisition phase in which the first echo signal is acquired.

11. The method as claimed in claim 1, wherein the first and the second switched diffusion gradients are each defined on the basis of an eddy current prevention technique.

12. The method as claimed in claim 1, further comprising:
reconstructing a first image dataset based upon the first set of diffusion-weighted scan data;
reconstructing a second image dataset based upon the second set of non-diffusion-weighted scan data; and
determining, based upon the first image dataset and the second image dataset, pixel-wise diffusion values including analog-to-digital (ADC) values.

13. The method as claimed in claim 12, wherein the act of reconstructing the first image dataset and the act of reconstructing the second image dataset are each performed using a retrospective correction technique.

* * * * *